United States Patent [19]

Laue

[11] 4,197,530

[45] Apr. 8, 1980

[54] PASSIVE INTRUSION DETECTION SYSTEM

[76] Inventor: James C. Fletcher, Administrator of the National Aeronautics and Space Administration, with respect to an invention of Eric G. Laue, San Marino, Calif.

[21] Appl. No.: 766,999

[22] Filed: Feb. 9, 1977

[51] Int. Cl.[2] .................... G08B 21/00; H01L 41/10

[52] U.S. Cl. .................... 340/602; 310/319; 331/65; 340/604

[58] Field of Search .................... 340/235, 602, 604; 324/61 AS, 79; 128/208; 361/178; 331/65; 310/8.7, 319

[56] References Cited

U.S. PATENT DOCUMENTS

| | | | |
|---|---|---|---|
| 2,571,171 | 10/1951 | Van Dyke | 340/235 |
| 3,296,549 | 1/1967 | Johnson | 331/158 X |
| 3,689,907 | 9/1972 | Guajardo | 340/235 |
| 3,895,912 | 7/1975 | Naumann | 331/65 X |

*Primary Examiner*—John W. Caldwell, Sr.
*Attorney, Agent, or Firm*—Monte F. Mott; John R. Manning; Paul F. McCaul

[57] ABSTRACT

An intrusion detection system in which crystal oscillators are used to provide a frequency which varies as a function of fluctuations of a particular environmental property of the atmosphere, e.g., humidity, in the protected volume. The system is based on the discovery that the frequency of an oscillator whose crystal is humidity sensitive, varies at a frequency or rate which is within a known frequency band, due to the entry of an intruder into the protected volume. The variable frequency is converted into a voltage which is then filtered by a filtering arrangement which permits only voltage variations at frequencies within the known frequency band to activate an alarm while inhibiting the alarm activation when the voltage frequency is below or above the known frequency band.

10 Claims, 2 Drawing Figures

PASSIVE INTRUSION DETECTION SYSTEM

ORIGIN OF THE INVENTION

The invention described herein was made in the performance of work under a NASA contract and is subject to the provisions of Section 305 of the National Aeronautics and Space Act of 1958, Public Law 85-568 (72 Stat. 435;42 USC 2457).

BACKGROUND OF THE INVENTION

1. Field of the Invention

The present invention generally relates to an intrusion detection system and, more particularly, to a passive intrusion detection system for indicating entry of an intruder into a protected volume.

2. Description of the Prior Art

Quartz crystal microbalance (QCM) instruments have been proposed to measure different phenomena such as wind velocity, direction, temperature as well as air humidity, contaminants in gas systems as well as in biological studies. Basically, in these studies quartz crystals are coated with different materials which affect the crystals' sensitivities to the phenomena to be measured. These crystals affect the frequencies of oscillators, with the changes in frequencies being measured to indicate the changes in the phenomena being measured.

There are many situations in which it is desired to detect the intrusion of an unauthorized person or animal into a protected volume, containing sensitive and/or dangerous materials, such as radioactive material or classified documents. Presently available infrared light and ultrasonic beam intrusion protection systems are quite inadequate since they can be perceived by an intruder, tampered by him and thus defeated. Also, presently existing systems produce an excessive number of false alarms and often require sensitive adjustments whenever the content in the protected volume is changed.

OBJECTS AND SUMMARY OF THE INVENTION

It is a primary object to provide a new intrusion detection system.

Another object of the invention is to provide an intrusion detection system for an enclosed volume which produces relatively few false alarms.

A further object of the present invention is to provide an essentially tamperproof intrusion detection system for an enclosed volume which is relatively inexpensive, easily adjustable for the protected enclosed volume so as to produce relatively few false alarms.

These and other objects of the invention are achieved in one embodiment in which a quartz crystal microbalance system is used. The system includes at least one nude quartz crystal used as the frequency determining element of at least one oscillating circuit. The crystal is sensitive to changes of a specific environmental property in the atmosphere in the enclosed volume, e.g., humidity, thereby changing the frequency as a result of humidity changes. A filtering arrangement is incorporated to distinguish between the rate of change of the frequency due to changes in humidity as a result of the entry of an intruder and the rates of change in frequency due to humidity changes as a result of other causes. The function of the filtering arrangement is to minimize the production of false alarms.

The novel features of the invention are set forth with particularity in the appended claims. The invention will best be understood from the following description when read in conjunction with the accompanying drawings.

DESCRIPTION OF THE PREFERRED EMBODIMENTS

Figure 1:
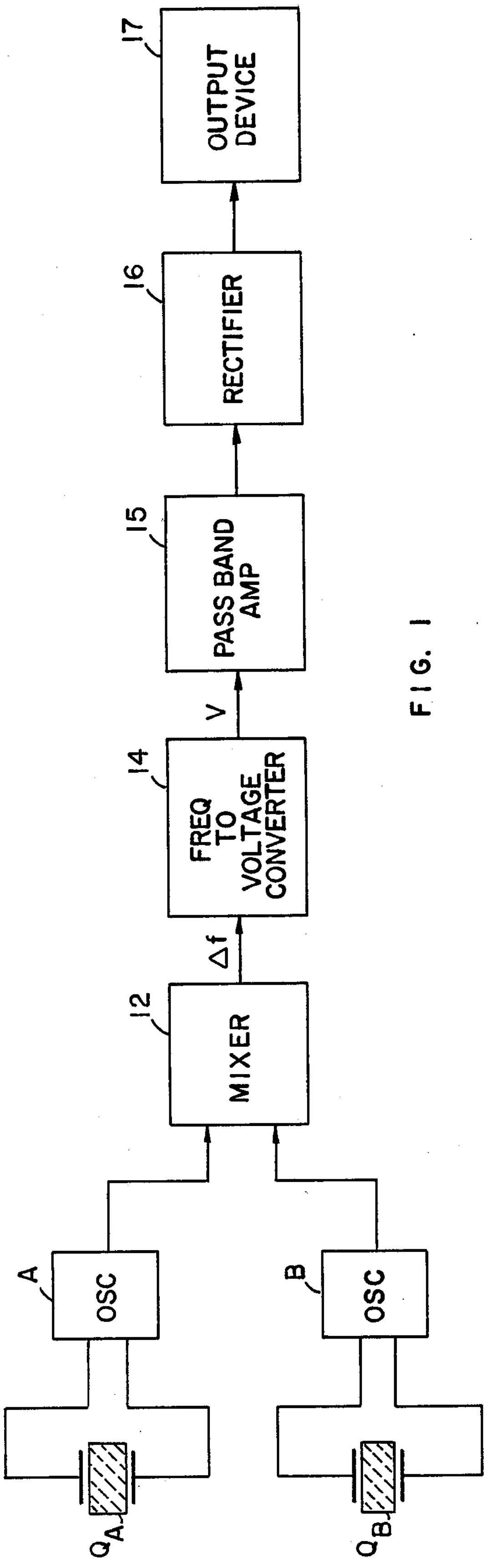
FIG. 1 is a block diagram of one embodiment of the invention.

Attention is directed to FIG. 1 wherein A designates a first frequency oscillator, whose frequency is controlled by a quartz crystal $Q_A$. A similar oscillator B has its frequency controlled by another quartz crystal $Q_B$. The frequency outputs of the two oscillators are mixed by a mixer 12 whose output frequency $\Delta f$ is the difference between the frequencies of oscillators A and B.

The crystal $Q_A$ is sensitive to changes in humidity, for example, however, if desired, it may be coated with known materials which can enhance its sensitivity to humidity changes in the protected volume. $Q_B$ is protected from exposure to the atmosphere and therefore the frequency output of oscillator B is held constant. Thus, any change in humidity in the protected volume affects $Q_A$ and therefore the frequency of oscillator A while that of oscillator B remains constant. Consequently when humidity in the atmosphere changes $\Delta f$ changes. A larger change in humidity results in a larger change in the frequency difference $\Delta f$ from mixer 12.

The frequency difference $\Delta f$ from mixer 12 is converted into a voltage V by a frequency to voltage converter 14. The voltage V is amplified by a bandpass amplifier 15, whose output is rectified by a rectifier 16. When the output of the latter exceeds a selected amplitude an output device 17 is activated. The output device may be an alarm, a light indicator, a recorder or any other similar device. In practice the output device may include a latching circuit, so that once the output device is activated, it remains activated until it is manually turned off by an operator. For explanatory purposes hereafter the output device 17 will be referred to as the alarm 17.

It has been discovered that occasional electrical storms or power line "bumps" produce spurious responses evidenced by very rapid, short-duration oscillator frequency changes. Also, slowly varying changes in oscillator frequency often occur due to diurnal variation in relative humidity or temperature or by the usual hunting of an air conditioner system. In one example, it was discovered that the rate of change of oscillator frequency due to an intruder is within a bandpass of 0.5 to 5 seconds. Thus, in the particular example, the bandpass of amplifier 15 is chosen to be limited to between 0.5 second and 5 seconds or between 0.2 Hz and 2.0 Hz. By limiting the bandpass of amplifier 15 the changes in frequency at rates other than those caused by the entrance of an intruder do not cause the amplifier to trigger the alarm 17 and thereby produce false alarms. However, changes in frequency occurring at rates which are characteristic of the entry of an intruder will cause the amplifier to produce an output which will trigger the alarm 17 to produce a valid indication.

Preferably the humidity in the protected volume, e.g., a room, should be different than that outside the room. Consequently when an intruder enters the room either through a window or a door a significant change occurs in the humidity in the protected room. In addition the entrance of the intruder into the protected room results in a change in the humidity content of the room and an increase in the aerosol content of the room. Movement of the intruder creates turbulence in air flow with characteristic fluctuation of local humidity.

Figure 2:
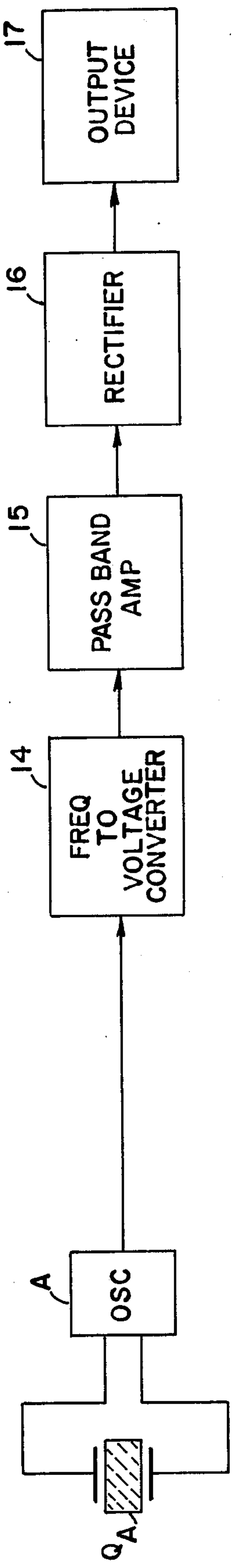
FIG. 2 is a block diagram of another embodiment of the invention.

Herebefore the system was described in connection with the two oscillators A and B and their crystals $Q_A$ and $Q_B$, where only $Q_A$ is sensitive to humidity changes. While $Q_B$, for simplicity may be left in its sealed environmentally protected case, it is also possible to enhance the system sensitivity to intrusion by using a nude crystal whose temperature coefficient, i.e., frequency vs temperature, is opposite that of $Q_A$. Heat of adsorbtion of a specific crystal B coating is another method of increasing the specificity of the system response. Such an arrangement is believed to be preferable. It permits one to use high frequency oscillators, e.g., 1 mHz to 30 mHz, and thereby increase the system's sensitivity, while the frequency difference Δf, which is a low frequency, is converted into a varying amplitude voltage. However, the invention is not intended to be limited to the two oscillators embodiment. If desired oscillator B with its crystal $Q_B$ and the mixer 12 may be eliminated. In such a case the output frequency of oscillator A is supplied directly to converter 14 as shown in FIG. 2.

The passband of 0.5 second to 5 seconds for amplifier 15 is presented for explanatory purposes only, and is based on one experimental system in which the rate of change of frequency due to other than an intruder was greater than 5 seconds while the rate of change of frequency due to unusual electrical storms or the like was less than 0.5 second. In any practical application the bandpass will have to be determined experimentally. From experiments conducted to date it seems clear that the rate of change of oscillator frequency due to electrical storms or very sudden changes in humidity is considerably higher than the rate of change of oscillator frequency due to humidity changes produced by an intruder. Thus, the upper bandpass limit can be easily established. As to the lower limit the rate of change of oscillator frequency due to diurnal humidity and temperature changes and/or air conditioner system hunting is typically (600—1200 seconds) lower than that produced by an intruder. Thus, the lower band limit can be established depending on the actual rate of change of oscillator frequency produced due to other than the intruder's entry into the protected room.

The invention is not intended to be limited only to sensing the humidity in the atmosphere. Any other environmental parameter or property of the atmosphere may be sensed. As used herein the term an environmental property of the atmosphere intends to refer to the typical characteristics of or content in the atmosphere. Examples of environmental properties of the atmosphere, in addition to humidity, include atmosphere temperature, dust content in the atmosphere, ozone content in the atmosphere, humanoid aerosols or the like. The term is not intended to include specially-induced phenomena, such as infra-red light, ultrasonic waves or the like.

The primary requirement is to employ a crystal such as $Q_A$ which is very sensitive to the particular environmental property of the atmosphere which is to be sensed, while the other crystal $Q_B$ is either less sensitive to the atmospheric property which is being sensed, completely protected therefrom, or sensitive to a different parameter with a frequency sensitivity of the opposite polarity. It is clear however that only those atmosphere properties which change in the protected room as a result of the entrance of an intruder should be sensed in accordance with the present invention.

The system, except for the alarm, can be fabricated to be very small so as to be unnoticeable. For example, it can be installed in the return duct of the ventilation system of an air conditioning system so that its presence in the room is not detectable, thereby preventing tampering with its operation.

The previously described embodiments are essentially of the analog type. If desired some digital circuitry may be employed. For example, the frequency from oscillator A when one oscillator is used or the frequency difference Δf from mixer 12 may be supplied to a counter which provides a digital count of the frequency. The counter can be operated to reset at the end of a selected period, e.g., 0.1 second, and start a new count. Just prior to being reset the entire count in the counter or at least several of its least significant digits may be supplied to a digital to analog converter which would convert the count into an analog signal, e.g., a voltage. The output voltage can then be filtered by a passband filter, amplified and rectified to activate the alarm 17 only when the frequency changes at a rate which is due to the entry of an intruder into the protected room.

From the foregoing it should thus be appreciated that the present invention comprises an intrusion detection system. It is based on sensing changes in an environmental property of the air or atmosphere in the protected volume. The environmental property is one which is affected by the entry of an intruder. The sensed changes in the property are indicated by changes in the frequency of an oscillator. The frequency is used to provide a first signal, such as the voltage from converter 14, that changes at a rate related to the rate of change of the sensed property. The rate of change of the sensed property is within a definable range, e.g., 0.5 second-5 seconds, when an intruder enters the protected volume. The system includes circuitry to provide an output signal which activates an output device, e.g., an alarm, only when the first signal changes at a rate within the definable range. By limiting the production of the output signal to occur only when the rate of change of the sensed atmosphere property is within the definable range, few if any false indications, due to changes of the sensed property take place.

Although particular embodiments of the invention have been described and illustrated herein, it is recognized that modifications and variations may readily occur to those skilled in the art and consequently, it is intended that the claims be interpreted to cover such modifications and equivalents.

What is claimed is:

1. A system for detecting the entry of an intruder in a prtoected volume, containing atmosphere, comprising:

first means including at least a first frequency oscillator with a frequency-controlling element which is sensitive to changes in a selected environmental property of the atmosphere in said protected volume for providing a variable output frequency which changes at a rate related to the rate of changes of said selected environmental property in the atmosphere in said protected volume, only as a result of the intrusion of an intruder into said volume, diurnal changes in the environment in said volume, or abrupt environmental changes outside said volume, means for converting the output frequency into a first signal whose amplitude is related to the output frequency, second means including bandpass filtering means for filtering said first signal to provide a control signal only when the frequency of amplitude changes of said first signal is within a predetermined frequency band; and output means responsive to said control signal for providing an indication, indicative of the entry of an intruder into said protected volume.

2. The system as described in claim 1 wherein said element of said first frequency oscillator is a crystal which is sensitive to changes in said selected environmental property of said atmosphere, with the frequency from said oscillator, definable as a first frequency.

3. The system as described in claim 1 wherein said first means include a second frequency oscillator which provides a second frequency which is substantially constant and is independent of changes in the selected environmental property, and means for providing said output frequency as a function of the difference between said first and second frequencies.

4. The system as described in claim 3 wherein each of said first and second frequencies is not less than 1 mHz.

5. The system as described in claim 3 wherein said selected environmental property is humidity and the difference between said first and second frequencies varies at a rate of about 0.2 to 2 cycles per second.

6. A method of detecting the intrusion of an intruder into a protected volume, the steps comprising:

sensing changes in an environmental property of the atmosphere in said volume which changes due to diurnal changes in the atmospheric environment in said volume or due to abrupt environmental changes outside said volume and also changes at a rate within a predetermined range due to the entry of an intruder into said volume; and providing an output indication, indicative of the entry of an intruder into said volume only when the sensed environmental property changes at a rate within said predetermined range.

7. A method as described in claim 6 wherein sensing changes includes:

placing a crystal oscillator in said volume, wherein the crystal is sensitive to the particular environmental property to be sensed, whereby the oscillator frequency varies at a rate related to the rate at which said environmental property changes;

the step of providing includes:

converting the change of frequency of said oscillator into an analog signal which changes at the rate of change of the frequency, filtering the analog signal to provide a control signal only when the analog signal varies at a frequency within said predetermined range which is only due to the entry of an intruder within said predetermined range; and activating an indicating device only when said control signal is provided.

8. A method as described in claim 7 wherein changes in humidity in the protected volume are sensed and the predetermined range of rate change of the humidity is on the order of 0.2 to 2 cycles per second.

9. A method as described in claim 6 wherein the environmental property is humidity and the sensing changes include:

placing a first oscillator in said volume, said first oscillator being sensitive to humidity changes in said volume, with its frequency varying at a rate related to the rate the humidity changes in the volume, placing a second oscillator in said volume which provides a substantially constant frequency which is independent of humidity changes and providing a humidity-dependent frequency which is the difference between the frequencies of the first and second oscillators, and the step of providing includes:

converting the humidity-dependent frequency into an analog signal, which changes amplitude at the rate of change of the humidity-dependent frequency, filtering the analog signal to provide a control signal only when the analog signal amplitude varies at a frequency within said predetermined range due to the intrusion of an intruder into said volume; and activating an indicating device with the control signal.

10. A method as described in claim 9 wherein the control signal is produced only when the analog signal amplitude varies at a frequency on the order of 0.2 to 2 cycles per second.

* * * * *